(12) United States Patent
Qi

(10) Patent No.: US 10,084,073 B2
(45) Date of Patent: Sep. 25, 2018

(54) LATERAL INSULATED-GATE BIPOLAR TRANSISTOR AND MANUFACTURING METHOD THEREFOR

(71) Applicant: CSMC TECHNOLOGIES FAB1 CO., LTD., Wuxi New District, Jiangsu (CN)

(72) Inventor: Shukun Qi, Jiangsu (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 15/537,753

(22) PCT Filed: Sep. 28, 2015

(86) PCT No.: PCT/CN2015/090914
§ 371 (c)(1),
(2) Date: Jun. 19, 2017

(87) PCT Pub. No.: WO2016/095585
PCT Pub. Date: Jun. 23, 2016

(65) Prior Publication Data
US 2018/0069107 A1    Mar. 8, 2018

(30) Foreign Application Priority Data
Dec. 19, 2014  (CN) .......................... 2014 1 0799646

(51) Int. Cl.
*H01L 21/00* (2006.01)
*H01L 29/00* (2006.01)
(Continued)

(52) U.S. Cl.
CPC .... *H01L 29/7394* (2013.01); *H01L 21/02236* (2013.01); *H01L 21/2253* (2013.01);
(Continued)

(58) Field of Classification Search
CPC ......... H01L 21/02236; H01L 21/26513; H01L 21/3065; H01L 21/324; H01L 21/7624;
(Continued)

(56) References Cited

U.S. PATENT DOCUMENTS

2011/0127602 A1    6/2011   Mallikarjunaswamy

FOREIGN PATENT DOCUMENTS

| CN | 102148240 | 8/2011 |
| CN | 102157550 | 8/2011 |
| CN | 102169893 | 8/2011 |

OTHER PUBLICATIONS

International Search Report for international application No. PCT/CN2015/090914, dated Jan. 7, 2016 (4 pages, including English translation).
(Continued)

*Primary Examiner* — Nikolay Yushin
(74) *Attorney, Agent, or Firm* — Hamre, Schumann, Mueller & Larson, P.C.

(57) ABSTRACT

Provided is a lateral insulated-gate bipolar transistor (LIGBT), comprising a substrate (10), an anode terminal and a cathode terminal on the substrate (10), and a drift region (30) and a gate (61) located between the anode terminal and the cathode terminal. The anode terminal comprises a P-type buried layer (52) on the substrate (10), an N-type buffer region (54) on the P-type buried layer (52), and a P+ collector region (56) on the surface of the N-type buffer region (54). The LIGBT further comprises a trench gate adjacent to the anode terminal, wherein the trench gate penetrates from the surfaces of the N-type buffer region (54) and the P+ collector region (56) to the P-type buried layer (52), and the trench gate comprises an oxidation layer (51) on the inner surface of a trench and polysilicon (53) filled into the oxidation layer.

14 Claims, 2 Drawing Sheets

(51) Int. Cl.
   *H01L 29/739* (2006.01)
   *H01L 29/423* (2006.01)
   *H01L 21/265* (2006.01)
   *H01L 29/66* (2006.01)
   *H01L 21/225* (2006.01)
   *H01L 21/3065* (2006.01)
   *H01L 21/02* (2006.01)
   *H01L 21/762* (2006.01)
   *H01L 21/324* (2006.01)

(52) U.S. Cl.
   CPC .... *H01L 21/26513* (2013.01); *H01L 21/3065* (2013.01); *H01L 21/324* (2013.01); *H01L 21/7624* (2013.01); *H01L 29/4236* (2013.01); *H01L 29/42364* (2013.01); *H01L 29/66325* (2013.01)

(58) Field of Classification Search
   CPC ............. H01L 29/7394; H01L 29/4236; H01L 29/42364; H01L 29/66325
   See application file for complete search history.

(56) References Cited

OTHER PUBLICATIONS

Lee, You-Sang et al., "Analysis of Dual-Gate LIGBT With Gradual Hole Injection," IEEE Transactions on Electron Devices, Sep. 2001, vol. 48, No. 9, pp. 2154-2160.

LATERAL INSULATED-GATE BIPOLAR TRANSISTOR AND MANUFACTURING METHOD THEREFOR

FIELD OF THE INVENTION

The present disclosure relates to semiconductors, and more particularly relates to a lateral insulated-gate bipolar transistor, and a manufacturing method of the lateral insulated-gate bipolar transistor.

BACKGROUND OF THE INVENTION

Lateral Insulated-Gate Bipolar Transistor (LIGBT) is usually employed as an output stage of high-voltage power-driven integrated circuit. Along with the low conduction voltage drop due to the conductivity modulation effect, the LIGBT suffers from problem of long turn-off time caused by minor carriers resituated in the drift region. Therefore, how to strike a balance between the open-state voltage drop and the turn-off time has become a direction for continuous improvement of the LIGBT device.

SUMMARY OF THE INVENTION

Accordingly, it is necessary to provide an LIGBT and a manufacturing method thereof which can be quickly turned off.

A lateral insulated-gate bipolar transistor includes: a substrate; an anode terminal and a cathode terminal formed on the substrate; wherein the anode terminal comprising a P-type buried layer formed on the substrate, an N-type buffer region formed on the P-type buried layer, and a P+ collector region formed on a surface of the N-type buffer region; a drift region and a gate located between the anode terminal and the cathode terminal; a trench gate extending from the N-type buffer region and a surface of the P+ collector region to the P-type buried layer, the trench gate comprising an oxidation layer formed on an inner surface of a trench and polysilicon filled in the trench and on the oxidation layer.

A method of manufacturing a lateral insulated-gate bipolar transistor includes the following steps of: providing a substrate having a drift region; implanting P-type ions into the drift region via a high energy ions implantation, thus forming a P-type buried layer; implanting N-type ions on the P-type buried layer, thus forming an N-type buffer region; performing a thermal drive-in to diffuse the implanted P-type ions and N-type ions; implanting P-type ions into the drift region, performing thermal annealing to form a P-type body region; performing lithography and etching to form a trench extending from a surface of the N-type buffer region into the P-type buried layer; forming an oxide layer on an inner surface of the trench; filling the trench with polysilicon; and performing ion implantation to form a P+ collector region on the surface of the N-type buffer region, and forming a P+ region and an N+ region on a surface of the P-type body region; wherein the P+ collector region is in contact with the oxide layer.

According to the aforementioned lateral insulated-gate bipolar transistor, when the LIGBT is turned off, the P+ region of the collector and the trench gate are reverse biased, the parasitic PMOS is turned on and in an amplified state, which starts to extract the remaining minority carriers (holes) in the drift region. By adjusting the thickness of the gate oxide, the device withstand voltage can be controlled and the faster switching speed can be guaranteed, thus achieving the purpose of quick turning off.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present. As used herein, the terms "vertical", "horizontal", "left", "right" and similar expressions are for illustrative purposes only.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
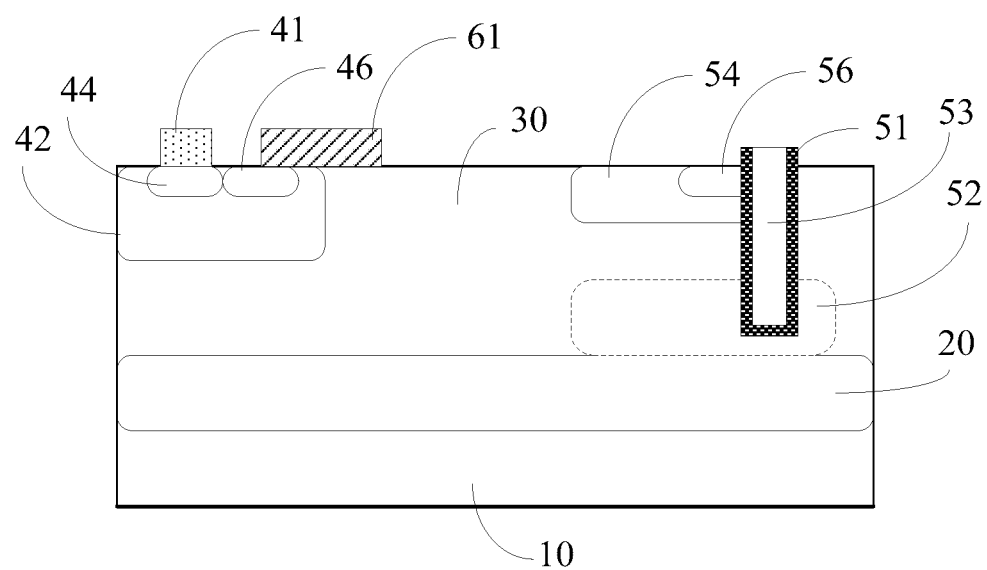
FIG. 1 is a cross-sectional view of a lateral insulated-gate bipolar transistor according to one embodiment.

FIG. 1 is a cross-sectional view of a lateral insulated-gate bipolar transistor according to one embodiment. The lateral insulated-gate bipolar transistor includes a substrate 10, an anode terminal and a cathode terminal formed on the substrate 10, a drift region 30 and a gate 61 located between the anode terminal and the cathode terminal, and a trench gate. The anode terminal includes a P-type buried layer 52 formed on the substrate, an N-type buffer region 54 formed on the P-type buried layer 52, and a P+ collector region 56 formed on a surface of the N-type buffer region 54. The cathode terminal includes a P-type body region 42 located on the substrate 10, and a P+ region 44 and an N+ region 46 located on a surface of the P-type body region 42, and a cathode metal 41 serves as an electrode of an emitter. The gate 61 includes a gate oxide layer and a polysilicon gate. The trench gate extends from the N-type buffer region 54 and a surface of the P+ collector region 56 to the P-type buried layer 52. The trench gate includes an oxidation layer 51 formed on an inner surface of a trench and polysilicon 53 filled in the trench and on the oxidation layer 51.

In the foregoing lateral insulated-gate bipolar transistor, a longitudinal P-channel MOSFET is formed by the P+ collector region 56, the N-type buffer region 54, the P-type buried layer 52, the oxidation layer 51, and the polysilicon 53 (wherein the oxidation layer 51 serves as a gate oxide and the polysilicon 53 serves as the polysilicon gate). When the gate 61 of the lateral insulated-gate bipolar transistor is forward biased, the electron current flows from N+ region 46 of the emitter through the channel of the P-type body region 42 into the drift region 30 and the N-type buffer region 54 consequently. As the P+ region 56 of the anode terminal is forward biased, the holes are injected into the drift region 30 from the collector, and enter the P-type body region 42 due to the attraction of the electron, thus the lateral insulated-gate bipolar transistor is in an operation state. At that time, the parasitic longitudinal PMOSFET is turned off because the trench gate is connected to the anode terminal.

When the lateral insulated-gate bipolar transistor is turned off, the P+ region 56 of the collector and the trench gate are reverse biased, the longitudinal PMOSFET is turned on and in an amplified state, which starts to extract the remaining minority carriers (holes) in the drift region 30. By adjusting the thickness of the gate oxide (oxide layer 51), the device withstand voltage can be controlled and the faster switching speed is guaranteed, thus achieving the purpose of quick turning off. If the thickness of the gate oxide is too thin, the trench gate has a strong ability to reverse the channel formed by the N-type buffer 54/drift region 30, and the parasitic longitudinal PMOS has a faster switching speed, nevertheless, the device withstand voltage is low due to the influence of the electric field of the oxide layer 51. On the contrary, if the gate oxide is too thick, the device withstand voltage is increased, but the switching speed will be decreased, which is not favorable to life control of the minority carrier in the LIGBT devices. After comprehensive theoretical analysis and practical application, according to one embodiment, the thickness of the oxide layer 51 ranges from 800 Å to 2000 Å. Specifically, in one embodiment where the oxide layer 51 has a thickness of 1000 Å, the device has forward blocking voltage of 600V and negative reverse blocking voltage of 40V.

In the embodiment shown in FIG. 1, the N-type buffer region 54 is not deep enough to reach the P-type buried layer 52, such that the P-type buried layer 52 is separated from the N-type buffer region 54 by the drift region 30.

Silicon-on-insulator (SOI) technology is becoming increasingly important in HVIC and SPIC applications, while the IGBT device has gradually played an important role in the field of power device applications due to its low on-resistance characteristics caused by high input impedance and conductivity modulation effect. Compared to silicone junction isolated devices, the LIGBT device of SOI type achieves an increasing application in the automotive electronics, home electronics and communications and industrial applications due to its features of low leakage, low open-circuit resistance, high input impedance, high package density, fast switching, good noise reduction effect and feasibility under high temperature work caused by trench isolation. FIG. 1 shows a SOI type transverse insulated gate bipolar transistor (SOI-LIGBT), which includes a buried oxide layer 20 located between the substrate 10 and the drift region 30. The substrate 10 is a P-type substrate, and the drift region 30 is an N-type drift region.

Figure 2:
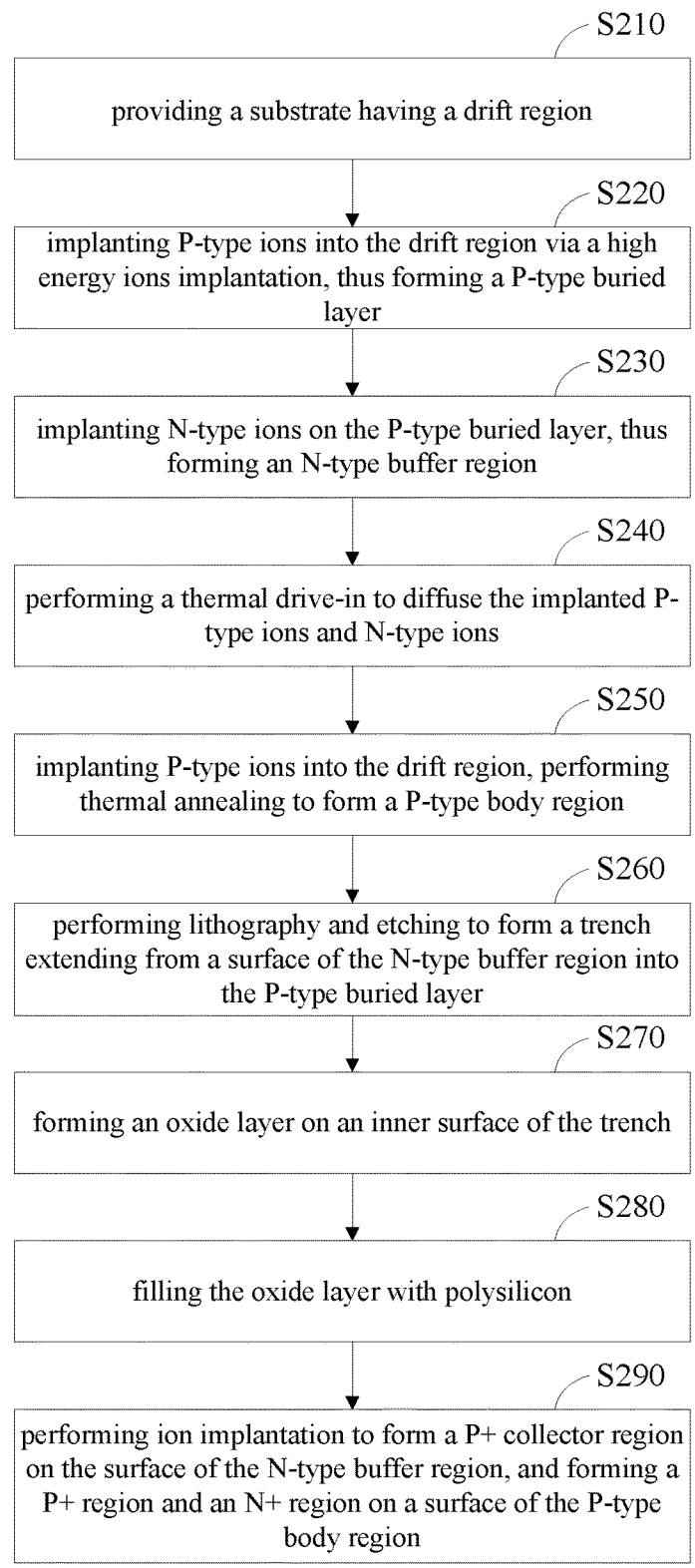
FIG. 2 is a flow chart of a method of manufacturing the lateral insulated-gate bipolar transistor according to one embodiment.

Referring to FIG. 2, according to an embodiment, a method of manufacturing a lateral insulated-gate bipolar transistor includes the following steps:

In step S210, a substrate having a drift region is provided.

In the present embodiment, a silicon wafer is provided which has a substrate, a buried oxygen layer formed on a substrate, and a drift region formed on the buried oxygen layer.

In step S220, P-type ions are implanted into the drift region via a high energy ions implantation, thus forming a P-type buried layer.

The implantation is performed at the anode terminal. Due to the higher requirements of the implantation depth, it is necessary to employ high energy ion implantation. In the present embodiment, the implanted ions are boron ions.

In step S230, N-type ions are implanted on the P-type buried layer, thus forming an N-type buffer region.

In step S240, a thermal drive-in is performed to diffuse the implanted P-type ions and N-type ions.

After diffusion, a longitudinal junction between the N-type buffer region and the P-type buried layer is formed, and the P-type buried layer is formed on the buried oxide layer.

In step S250, P-type ions are implanted into the drift region, thermal annealing is performed to form a P-type body region.

The implantation is performed at the cathode terminal to form the P-type body region, which serves as a base of LIGBT.

In step S260, lithography and etching are performed to form a trench extending from a surface of the N-type buffer region into the P-type buried layer.

In the present embodiment, the etching is performed by a reactive ion etching (RIE) process.

In step S270, an oxide layer is formed on an inner surface of the trench.

In the present embodiment, the oxide layer is formed on the sidewall and bottom surface of the trench via oxidation, which serves as a gate oxide of PMOSFET.

In step S280, the trench is filled with polysilicon.

In the present embodiment, the polysilicon gate formed in the trench by deposition serves as a gate of PMOS, and the polysilicon gate formed between the anode terminal and the cathode terminal serves as a gate of the LIGBT.

In step S290, ion implantation is performed to form a P+ collector region on the surface of the N-type buffer region, and a P+ region and an N+ region on a surface of the P-type body region.

An emitter, a collector and a drain of the P-channel MOSFET are formed, while the P+ collector region is in contact with the oxide layer in the trench and serves as a drain for the P-channel MOSFET.

Although the description is illustrated and described herein with reference to certain embodiments, the description is not intended to be limited to the details shown. Modifications may be made in the details within the scope and range equivalents of the claims.

What is claimed is:

1. A lateral insulated-gate bipolar transistor, comprising:
   a substrate;
   an anode terminal and a cathode terminal formed on the substrate; wherein the anode terminal comprising a P-type buried layer formed on the substrate, an N-type buffer region formed on the P-type buried layer, and a P+ collector region formed on a surface of the N-type buffer region;

a drift region and a gate located between the anode terminal and the cathode terminal;

a trench gate extending from the N-type buffer region and a surface of the P+ collector region to the P-type buried layer, the trench gate comprising an oxidation layer formed on an inner surface of a trench and polysilicon filled in the trench and on the oxidation layer.

2. The lateral insulated-gate bipolar transistor according to claim 1, wherein the P-type buried layer is separated from the N-type buffer region by the drift region.

3. The lateral insulated-gate bipolar transistor according to claim 1, wherein the lateral insulated-gate bipolar transistor is a silicon-on-insulator type lateral insulated-gate bipolar transistor, and the lateral insulated-gate bipolar transistor further comprises a buried oxide layer located between the substrate and the drift region, the P-type buried layer is located on the buried oxide layer.

4. The lateral insulated-gate bipolar transistor according to claim 1, wherein the substrate is a P-type substrate, and the drift region is an N-type drift region.

5. The lateral insulated-gate bipolar transistor according to claim 1, wherein the cathode terminal comprises a P-type body region located on the substrate, and a P+ region and an N+ region located on a surface of the P-type body region.

6. The lateral insulated-gate bipolar transistor according to claim 5, wherein the cathode terminal further comprises a cathode metal; the gate comprises a gate oxide layer, and a polysilicon gate located on the gate oxide layer.

7. The lateral insulated-gate bipolar transistor according to claim 6, wherein the gate oxide layer has a thickness of 800 angstroms to 2000 angstroms.

8. A method of manufacturing a lateral insulated-gate bipolar transistor, comprising the following steps of:
providing a substrate having a drift region;
implanting P-type ions into the drift region via a high energy ions implantation, thus forming a P-type buried layer;
implanting N-type ions on the P-type buried layer, thus forming an N-type buffer region;
performing a thermal drive-in to diffuse the implanted P-type ions and N-type ions;
implanting P-type ions into the drift region, performing thermal annealing to form a P-type body region;
performing lithography and etching to form a trench extending from a surface of the N-type buffer region into the P-type buried layer;
forming an oxide layer on an inner surface of the trench;
filling the trench with polysilicon; and
performing ion implantation to form a P+ collector region on the surface of the N-type buffer region, and forming a P+ region and an N+ region on a surface of the P-type body region; wherein the P+ collector region is in contact with the oxide layer.

9. The method of claim 8, wherein during the step of performing lithography and etching to form the trench extending from the surface of the N-type buffer region into the P-type buried layer, the etching is performed using a reactive ion etching process.

10. The method of claim 8, wherein during the step of forming the oxide layer on an inner surface of the trench, the oxide layer is formed by thermal oxidation; wherein during the step of filling the oxide layer with polysilicon, a polysilicon gate is formed by a deposition process.

11. The method of claim 8, wherein during the step of providing the substrate having the drift region, a buried oxide layer is formed between the drift region and the substrate; wherein during the step of implanting P-type ions into the drift region via the high energy ions implantation, the P-type buried layer is formed on the buried oxide layer.

12. The method of claim 8, wherein during the step of implanting P-type ions into the drift region via the high energy ions implantation, the implanted ions are boron ions.

13. The method of claim 8, wherein the substrate is a P-type substrate, and the drift region is an N-type drift region.

14. The method of claim 8, wherein the P+ collector region is in contact with the oxide layer in the trench, and the P+ collector region serves as a drain of a P-channel MOSFET.

* * * * *